United States Patent
Iwai et al.

(10) Patent No.: US 9,786,472 B2
(45) Date of Patent: Oct. 10, 2017

(54) PLASMA PROCESSING APPARATUS AND METHOD FOR MANUFACTURING ELECTRONIC COMPONENT

(71) Applicant: PANASONIC INTELLECTUAL PROPERTY MANAGEMENT CO., LTD., Osaka (JP)

(72) Inventors: Tetsuhiro Iwai, Osaka (JP); Shogo Okita, Hyogo (JP); Syouzou Watanabe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/873,255

(22) Filed: Oct. 2, 2015

(65) Prior Publication Data
US 2016/0240352 A1    Aug. 18, 2016

(30) Foreign Application Priority Data

Feb. 17, 2015   (JP) .................................. 2015-028927

(51) Int. Cl.
| | | |
|---|---|---|
| H01J 37/32 | (2006.01) | |
| C23C 16/458 | (2006.01) | |
| C23C 16/50 | (2006.01) | |
| H01L 21/67 | (2006.01) | |
| H01L 21/683 | (2006.01) | |
| H01L 21/687 | (2006.01) | |
| C23C 16/46 | (2006.01) | |

(52) U.S. Cl.
CPC ...... *H01J 37/3244* (2013.01); *C23C 16/4586* (2013.01); *C23C 16/466* (2013.01); *C23C 16/50* (2013.01); *H01J 37/321* (2013.01); *H01J 37/32724* (2013.01); *H01L 21/67109* (2013.01); *H01L 21/67132* (2013.01); *H01L 21/6831* (2013.01); *H01L 21/68735* (2013.01); *H01L 21/68742* (2013.01); *H01L 21/68785* (2013.01)

(58) Field of Classification Search
None
See application file for complete search history.

(56) References Cited

U.S. PATENT DOCUMENTS

| | | | | |
|---|---|---|---|---|
| 7,736,528 B2 * | 6/2010 | Okita | ..................... | H01J 37/321 156/345.35 |
| 8,125,757 B2 * | 2/2012 | Morooka | .......... | H01L 21/67069 361/234 |

(Continued)

FOREIGN PATENT DOCUMENTS

WO    2012/164857 A1    12/2012

*Primary Examiner* — Allan Olsen
(74) *Attorney, Agent, or Firm* — Pearne & Gordon LLP

(57) ABSTRACT

A plasma processing apparatus performs plasma processing on a substrate held by a carrier. The carrier includes a frame disposed around the substrate and a holding sheet which holds the substrate and the frame. The plasma processing apparatus includes: a chamber; a stage which is disposed within the chamber and has an upper surface on which the carrier is mounted; a gas hole which is provided at a position of the upper surface opposing a bottom surface of the frame and through which cooling gas is supplied between the stage and the carrier; and a plasma exciting unit which generates plasma within the chamber.

6 Claims, 6 Drawing Sheets

(56) References Cited

U.S. PATENT DOCUMENTS

| | | | | |
|---|---|---|---|---|
| 8,894,806 | B2* | 11/2014 | Koshimizu | H01J 37/32091 118/728 |
| 9,112,050 | B1* | 8/2015 | Lei | H01L 21/82 |
| 9,117,868 | B1* | 8/2015 | Nangoy | H01L 21/6833 |
| 2004/0261946 | A1* | 12/2004 | Endoh | H01J 37/32082 156/345.15 |
| 2006/0108231 | A1* | 5/2006 | Weichart | C25D 17/06 205/165 |
| 2014/0242780 | A1* | 8/2014 | Gauldin | H01L 21/3065 438/463 |
| 2015/0126038 | A1* | 5/2015 | Okita | H01J 37/321 438/715 |
| 2015/0170885 | A1* | 6/2015 | Ouye | H01J 37/32642 438/460 |
| 2015/0221553 | A1* | 8/2015 | Ouye | H01L 21/683 438/462 |

\* cited by examiner

PLASMA PROCESSING APPARATUS AND METHOD FOR MANUFACTURING ELECTRONIC COMPONENT

CROSS-REFERENCE TO RELATED APPLICATION(S)

This application is based on and claims priority from Japanese Patent Application No. 2015-028927 filed on Feb. 17, 2015, the entire contents of which are incorporated herein by reference.

BACKGROUND

1. Field of the Invention

One or more embodiments of the present invention relate to a plasma processing apparatus for performing plasma processing on a substrate held on a transfer carrier including a frame and a holding sheet, and a method for manufacturing an electronic component using the plasma processing apparatus and, in particular, relate to cooling of a substrate at a time of performing plasma processing.

2. Description of Related Art

There is a plasma processing apparatus for performing plasma processing in a state of holding a substrate on a holding sheet. In the plasma processing apparatus, plasma processing is performed for a carrier (transfer carrier), which serves as an object to be processed, holding a substrate. The transfer carrier includes a frame disposed around the substrate and a holding sheet for holding the substrate and the frame. The plasma processing apparatus includes a chamber, a stage which is disposed within the chamber and has an upper surface on which the transfer carrier is mounted, and a plasma exciting unit which generates plasma within the chamber. The stage usually has an electrostatic chucking mechanism for adhering the transfer carrier to the stage. An example of the plasma processing apparatus is described in WO-A1-2012/164857.

SUMMARY

In the related art, a transfer carrier holding a substrate is electrostatically attracted to a cooled stage, thereby obtaining effect of suppressing temperature increase of the substrate during plasma processing.

In a case where an object to be processed is not the transfer carrier but a substrate itself, if a substrate is electrostatically attracted to the stage and heat transfer gas such as He is supplied to a rear surface of the substrate as cooling gas from gas holes provided at a surface of the stage, cooling efficiency can be further improved.

However, in a case where the object to be processed is not a substrate itself but substrate held by the transfer carrier, there is a following problem in order to improve the cooling efficiency using the heat transfer gas. Specifically, in a case of supplying the heat transfer gas to a rear surface of the transfer carrier, the holding sheet above the gas holes may extend due to pressure of the heat transfer gas and abnormal discharge may occur during plasma processing. Thus, as a pressure of the heat transfer gas cannot be made sufficiently high, improvement of the cooling efficiency is difficult.

An object of one or more embodiments of the invention is to provide a plasma processing apparatus which can efficiently cool a substrate and a transfer carrier holding the substrate at a time of performing plasma processing on the substrate, and also provide a method for manufacturing an electronic component which includes performing plasma processing on a substrate using such the plasma processing apparatus to obtain electronic components from the substrate.

According to an aspect of the invention, there is provided a plasma processing apparatus which performs plasma processing on a substrate held by a carrier which includes a frame disposed around the substrate and a holding sheet which holds the substrate and the frame, the plasma processing apparatus including: a chamber; a stage which is disposed within the chamber and has an upper surface on which the carrier is mounted; a gas hole which is provided at a position of the upper surface opposing a bottom surface of the frame and through which cooling gas is supplied between the stage and the carrier; and a plasma exciting unit which generates plasma within the chamber.

According to another aspect of the invention, there is provided a method for manufacturing an electronic component using a plasma processing apparatus which includes a chamber, a stage disposed within the chamber, a gas hole provided at an upper surface of the stage, and a plasma exciting unit, the method including: preparing a carrier which holds a substrate as a start material of electronic components; mounting the carrier, which holds the substrate, on the upper surface of the stage; supplying cooling gas from the gas hole between the stage and the carrier after the carrier is mounted on the upper surface of the stage; and performing plasma processing on the substrate using plasma generated within the chamber by the plasma exciting unit after the carrier is mounted on the upper surface of the stage, thereby obtaining the electronic components, wherein the carrier includes a frame disposed around the substrate and a holding sheet which holds the substrate and the frame, and wherein the gas hole is provided at a portion of the upper surface of the stage opposing a bottom surface of the frame.

According to one or more embodiments of the invention, a transfer carrier holding a substrate as an object of plasma processing (for example, a substrate on which circuits are formed or a start material of electronic components) can be cooled efficiently.

DETAILED DESCRIPTION

Embodiments according to the invention will be explained in detail with reference to accompanying drawings. The invention is not limited to these embodiments but can contain modifications and changes of these embodiments.

Figure 1:
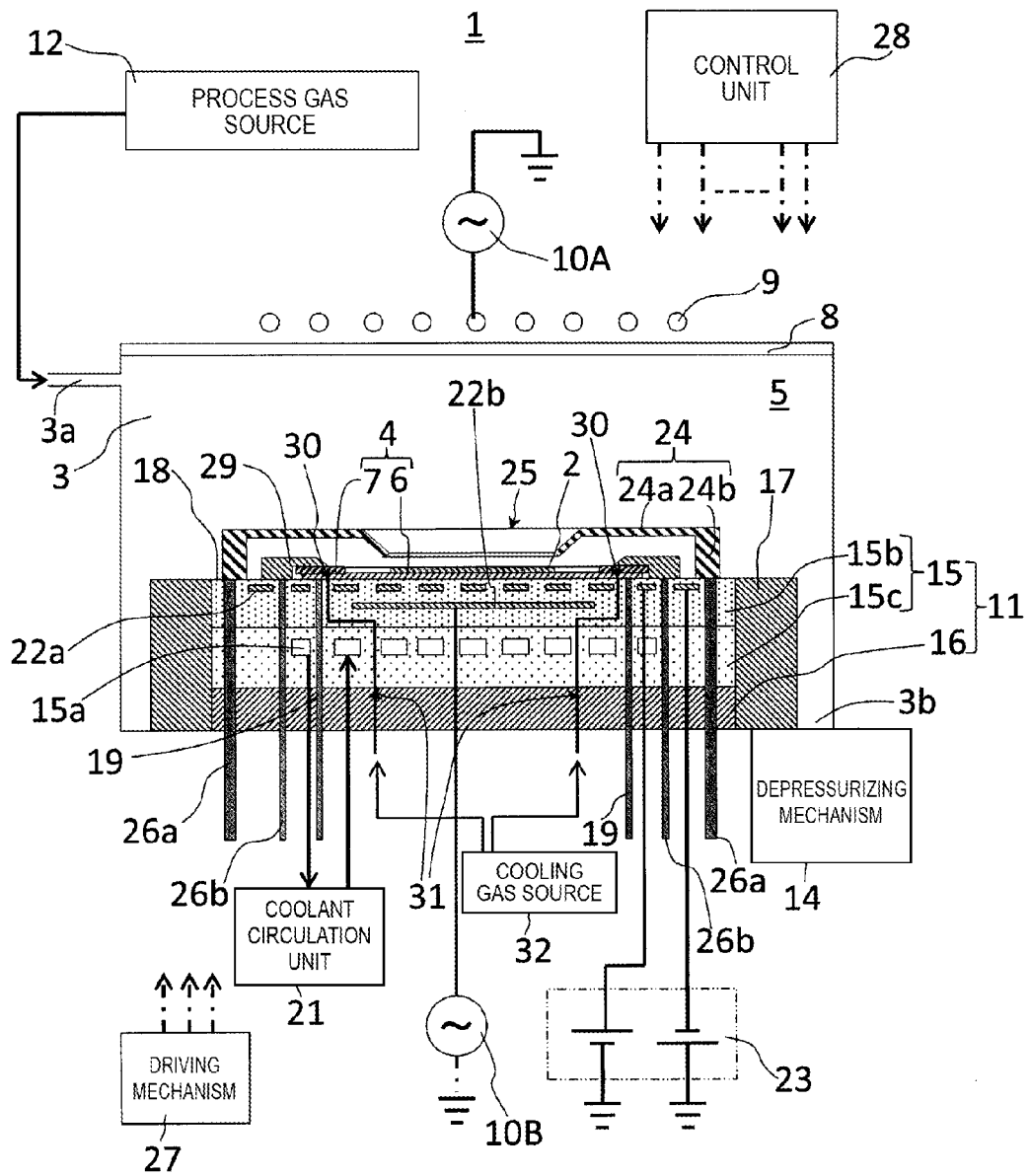
FIG. 1 is a sectional view schematically showing a plasma processing apparatus according to an embodiment of the invention.
Figure 2:
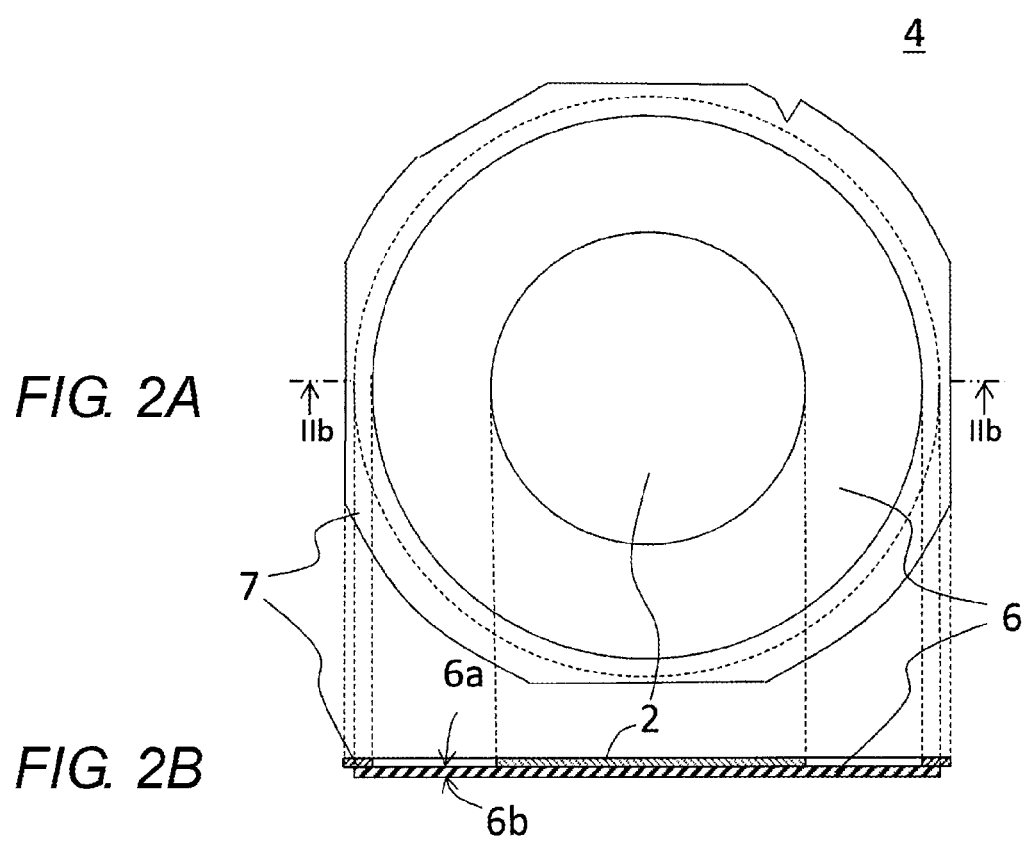
FIG. 2A is a top view showing an example of a transfer carrier which holds a substrate in FIG. 1.
FIG. 2B is a sectional view along line IIb-IIb in FIG. 2A.

FIG. 1 is a sectional view schematically showing structure of a plasma processing apparatus (plasma etching apparatus) 1 according to the first embodiment of the invention. FIG. 2A is a top view showing an example of a transfer carrier 4 which holds a substrate 2 in FIG. 1, and FIG. 2B is a sectional view cut along line IIb-IIb in FIG. 2A.

The transfer carrier 4 includes an annular frame 7 arranged around an outer periphery of the substrate 2 and a holding sheet 6. The holding sheet 6 has one surface coated with adhesive (adhesive surface 6a) and the other surface not coated with the adhesive (non-adhesive surface 6b). The substrate 2 and the frame 7 are held by the adhesive surface 6a. The frame 7 has rigidity and the holding sheet 6 is elastically extendable.

The plasma processing apparatus 1 performs plasma processing, for example, plasma dicing on the substrate 2 held on the transfer carrier 4. The plasma dicing is a method of cutting the substrate 2 such as a silicon wafer, on one major surface of which a plurality of integrated circuits (ICs) or the like are formed, along boundary lines (streets) by means of dry etching using plasma, thereby dividing into a plurality of ICs (electronic components).

The plasma processing apparatus 1 includes a chamber (vacuum vessel) 3 having a processing chamber 5, inner atmosphere of which can be depressurized, a process gas supply unit for supplying process gas into the processing chamber 5, a depressurizing mechanism 14 for depressurizing atmosphere within the processing chamber 5 and a plasma exciting unit for generating plasma within the processing chamber 5. A stage 11, which mounts thereon the transfer carrier 4 holding the substrate 2, is disposed within the processing chamber 5 (more specifically, at a bottom side portion of the processing chamber 5). The transfer carrier 4 holding the substrate 2 is loaded into the processing chamber 5 via an input/output port (not shown) formed at the chamber 3 to be able to open and close. The transfer carrier 4 is placed or mounted on the stage 11 in a manner that a surface of the transfer carrier opposite the substrate 2 is made in contact with an upper surface of the stage 11 in a state of exposing the one major surface of the substrate.

The process gas supply unit includes a process gas source 12 which contains the process gas to be supplied to the processing chamber 5, and a pipe (not shown) which supplies the process gas to the processing chamber 5 from the process gas source 12. The chamber 3 has a gas introduction port 3a continued to the processing chamber 5. The process gas necessary for generating plasma is supplied to the gas introduction port 3a through the pipe from the process gas source 12.

The chamber 3 has an exhaust port 3b continued to the processing chamber 5. A depressurizing mechanism 14 is coupled to the exhaust port 3b. The depressurizing mechanism 14 includes, for example, a vacuum pump. The depressurizing mechanism 14 exhausts atmosphere within the processing chamber 5 via the exhaust port 3b, thereby depressurizing the atmosphere within the processing chamber 5.

A plasma excitation unit includes an upper electrode (antenna) 9 and a radio frequency power supply 10A electrically connected to the upper electrode 9. The upper electrode 9 is provided above a dielectric wall 8 which closes a top portion of the processing chamber 5. By being supplied with voltage from the radio frequency power supply (first radio frequency power supply) 10A, the upper electrode 9 generates electromagnetic wave to ionize the process gas filled within the processing chamber to generate plasma. The transfer carrier 4 is placed on the stage 11 in a state of directing one surface thereof holding the substrate 2 toward the upper electrode 9. As the one major surface of the substrate 2 (major surface of the substrate opposite the holding sheet 6) is exposed toward the upper electrode 9, ions and radicals within the plasma generated by the upper electrode 9 is made incident on the one major surface, thereby etching the substrate 2.

The stage 11 is disposed at the bottom side portion of the processing chamber 5. The stage includes an electrode part 15 and a base 16 for holding the electrode part 15. An outer periphery of each of the electrode part 15 and the base 16 is surrounded by an exterior part 17. The electrode part 15 includes a thin dielectric part 15b, having a mounting surface 18 for mounting the transfer carrier 4 thereon, and a metal part 15c for supporting the dielectric part 15b.

A lower electrode 22b is provided within the electrode part 15 of the stage 11. The lower electrode 22b is connected to a radio frequency power supply (second radio frequency power supply) 10B. Bias voltage is applied to the lower electrode 22b from the second radio frequency power supply 10B, and thereby energy for making ions within the plasma incident on the substrate 2 can be controlled.

A flow passage 15a for flowing coolant (cooling water or the like) is provided within the metal part 15c forming the stage 11. A coolant circulation unit 21 is communicated with the flow passage 15a and circulates temperature-controlled coolant through the flow passage 15a. The stage 11 can be cooled effectively by circulating the coolant within the stage 11.

The stage 11 contains an electrostatic chucking electrode 22a. The electrostatic chucking electrode 22a is electrically connected to a DC power supply 23. The electrostatic chucking electrode 22a is preferably disposed near the mounting surface 18 of the dielectric part 15b forming the stage 11. In the example showing in the drawings, the electrostatic chucking electrode 22a is disposed above the lower electrode 22b. By applying voltage to the electrostatic chucking electrode 22a from the DC power supply 23, the stage 11 serves as an electrostatic chuck and thereby can adhere the substrate 2 to the mounting surface (that is, the upper surface of the stage 11) 18 together with the transfer carrier 4. As the stage 11 is cooled by the coolant as described above, each of the transfer carrier 4 and the substrate 2 can be cooled by adhering the transfer carrier 4 to the upper surface 18 of the stage 11. The electrostatic chucking electrode 22a may be a bipolar type or a unipolar type.

The stage 11 includes gas holes 30 for supplying cooling gas between the upper surface 18 of the stage 11 and the transfer carrier 4 (specifically, a rear surface of the transfer carrier).

The cooling gas is supplied to the gas holes 30 via respective pipes 31 from a cooling gas source 32 containing the cooling gas (for example, heat transfer gas such as helium gas). The cooling gas supplied between the upper surface 18 of the stage 11 and the transfer carrier 4 from the gas holes 30 promotes heat transfer between the stage 11 and the transfer carrier 4. As described above, although the transfer carrier 4 is cooled by being electrostatically attracted to the cooled stage 11, the cooling efficiency of the substrate 2 and the transfer carrier 4 can be further improved by the supply of the cooling gas.

In the embodiment according to the invention, it is important to form the gas holes 30 at respective positions of the upper surface 18 of the stage 11 (specifically, an upper surface of the electrode part 15) opposing a bottom surface of the frame 7. If the gas holes 30 are provided at respective positions of the upper surface 18 of the stage 11 opposing a bottom surface of the substrate 2, variation in distribution of temperature etc. may occur locally on the upper surface of the stage due to the influence of the gas holes 30. The substrate 2 subjected to the plasma dicing has a thin thickness and is placed on the upper surface 18 via the holding sheet 6 of a thin thickness. Thus, such the variation influences on a processed shape of the substrate 2. For example, there may arise such a problem that shape of the gas hole 30 is transferred on a processed surface of the substrate 2.

Upon completion of the dicing, as the substrate 2 is divided and hence a charged state of the transfer carrier 4 changes, an electrostatic chucking force between the transfer carrier 4 and the stage 11 reduces. In this case, if the gas holes 30 are provided at the positions opposing the bottom surface of the substrate 2, as a pressure of the cooling gas near the gas holes 30 is high, respective portions of the holding sheet 6 near the gas holes 30 may float up together with the substrate 2. As a result, a trouble such as abnormality of the processed shape or abnormal discharge may occur.

Further, as the holding sheet 6 has elasticity, if the respective gas holes 30 are disposed at positions each not opposing any of the bottom surface of the substrate 2 or the bottom surface of the frame 7 (that is, positions each opposing a bottom surface of the transfer carrier 4 where only the holding sheet 6 exists) at the upper surface 18 of the stage 11, respective portions of the holding sheet 6 near the gas holes 30 may be extended or wrinkles may be developed at the respective portions of the holding sheet 6 due to the pressure of the cooling gas, thereby degrading adhesiveness of the sheet. As a result, due to insufficient cooling, the holding sheet 6 may be partially burnt or abnormal discharge may occur. In a case where the holding sheet 6 is formed by insulation material which is unlikely electrostatically attracted, this trouble likely occur due to such the degradation of adhesiveness of the holding sheet 6.

As the respective gas holes 30 are formed at positions each opposing the bottom surface of the frame 7 (preferably, only positions each opposing the bottom surface of the frame 7) at the upper surface 18 of the stage 11 (specifically, the electrode part 15), the cooling gas is supplied to the bottom surface of the frame 7 via the holding sheet 6. Fine gaps are formed between the upper surface 18 of the stage 11 and the transfer carrier 4 depending on respective degrees of roughness of the upper surface 18 and the bottom surface of the transfer carrier 4. The cooling gas supplied to the frame 7 spreads into these gaps formed inevitably between the upper surface 18 and the transfer carrier 4, thereby promoting cooling of the substrate 2 and the transfer carrier 4.

As the atmosphere within the processing chamber 5 is depressurized, the cooling gas leaked into the processing chamber 5 from the gaps between the upper surface 18 and the transfer carrier 4 is exhausted from the processing chamber 5 by the depressurizing mechanism 14. The frame 7 has suitable rigidity and hence does not deform even if the cooling gas is supplied. Thus, the abnormal discharge does not occur. In this manner, according to this embodiment, the trouble such as the abnormal discharge due to the arrangement of the gas holes 30 can be suppressed. Further, as each of the gas holes 30 is not disposed at a position opposing the bottom surface of the substrate 2, there does not arise such the problem that the shape of the gas hole 30 is transferred on the processed surface of the substrate 2.

The number of the gas hole 30 formed on the stage 11 (specifically, at the upper surface of the electrode part 15) may be single. However, this number is preferable plural in terms of uniformly and efficiently cooling the substrate 2 and the transfer carrier 4 as much as possible. For example, a plurality of the gas holes 30 may be arranged in a ring fashion with an interval therebetween at respective positions opposing the bottom surface of the frame 7. In this case, the gas holes 30 may be provided with a predetermined interval (for example, an interval of 50 to 100 mm, preferably an interval of 30 to 70 mm) along the shape of the frame 7. The number of the gas holes 30 formed on the stage 11 may be set depending on a diameter of the frame 7. For example, in a case where the diameter of the frame 7 is 300 mm, the number of the gas holes 30 formed on the stage 11 is preferably in a range from 13 to 29. Alternatively, for example, in a case where the diameter of the frame 7 is 400 mm, the number of the gas holes 30 formed on the stage 11 is preferably in a range from 17 to 41.

The stage 11 is provided with a plurality of frame lift pins 19 each penetrating the stage 11. The frame lift pins 19 performs, in cooperation with a not-shown transfer arm, loading/unloading of the transfer carrier 4 into/from the processing chamber 5. Each of the frame lift pins 19 is driven so as to be lifted up and lowered by a predetermined driving mechanism 27. Each of the frame lift pins 19 is movable between a lowered position (processing position) of the plasma processing apparatus 1 and a lifted-up position at which the transfer carrier 4 is loaded and unloaded by means of the transfer arm. The transfer carrier 4 moves up and down together with the frame lift pins 19. A processing of mounting the transfer carrier 4 on the stage 11 is performed when the frame lift pins 19 are lowered.

A cover 24 is provided above the stage 11 within the processing chamber 5. This cover covers the frame 7 and a part of the holding sheet 6 of the transfer carrier 4 mounted on the stage 11 at a time of performing plasma processing. The cover 24 has a circular outer contour which may be formed to be sufficiently larger than an outer contour of the transfer carrier 4. The cover 24 includes a doughnut-shaped roof part 24a and a cylindrical peripheral side part 24b which extends to the stage 11 side via a bent part from the periphery of the roof part 24a. The roof part 24a includes a circular window 25 at the center thereof. At a time of performing plasma processing, preferably, the roof part 24a covers a part of the holding sheet 6 and at least a part of the frame 7, and the window 25 expose at least a part of the substrate 2 to plasma. A tapered recess which is gradually raised toward the center is formed at a periphery of the window 25 of the roof part 24a.

When the cover 24 covers the frame 7, a lower end of the peripheral side part 24b of the cover 24 is made in contact with the stage 11. The lower end of the peripheral side part 24b is coupled with upper ends of one or more (two, in the embodiment) first lift rods 26a, each penetrating the stage 11, and is movable up and down. The first lift rods 26a are driven so as to be lifted up and lowered by the predetermined driving mechanism 27, and the cover 24 is moved up and down together with the first lift rods 26a. Specifically, the cover 24 is movable up and down between a lowered position, for covering the frame 7 and the part of the holding sheet 6 of the transfer carrier 4, and a lifted-up position at which the transfer carrier 4 is loaded and unloaded.

In FIG. 1, a press mechanism 29 is provided at a position which is above the stage 11 and covered by the cover 24. The press mechanism 29 presses the frame 7 against the upper surface 18 of the stage 11. In the example shown in the drawings, the press mechanism 29 is provided independently from the cover 24 and so as to be covered by the cover 24. The press mechanism 29 is coupled to upper ends of one or more (two, in the embodiment) second lift rods 26b each penetrating the stage 11. The second lift rods 26b are driven by the driving mechanism 27 schematically shown in FIG. 1, thereby moving the press mechanism 29 up and down. The press mechanism 29 is movable between a lowered position, for pressing the frame 7 against the upper surface 18, and a lifted-up position at which the transfer carrier 4 is loaded and unloaded. In the lowered position, the press mechanism 29 presses the frame 7 against the upper surface 18.

The press mechanism 29 presses the frame 7 of the transfer carrier 4, mounted on the upper surface 18 of the stage 11, against the upper surface 18 to straighten distortion of the frame. Thus, slits generated due to the distortion between the frame 7 and the upper surface 18 can be reduced. As adhesiveness between the transfer carrier 4 and the upper surface 18 at the frame 7 portion can be enhanced in this manner, an amount of leakage of the cooling gas into the processing chamber from the outer edge of the frame 7 can be reduced. Thus, wraparound of the cleaning gas to the center portion of the transfer carrier, where the substrate 2 is mounted, can be promoted. As a result, in a case where the plasma processing apparatus 1 is provided with the press mechanism 29, cooling effect of the transfer carrier 4 and the substrate 2 can be further enhanced.

An operation of each of the constituent elements of the plasma processing apparatus 1 is controlled by a control unit 28 schematically shown in FIG. 1. The constituent elements of the plasma processing apparatus 1 includes the first and second radio frequency power supplies 10A, 10B, the process gas source 12, the depressurizing mechanism 14, the coolant circulation unit 21, the cooling gas source 32, the DC power supply 23, the driving mechanism 27, and so on. More specifically, the driving mechanism 27 controls respective operations of the frame lift pins 19, the first lift rods 26a and the second lift rods 26b in accordance with instructions from the control unit 28.

Figure 3:
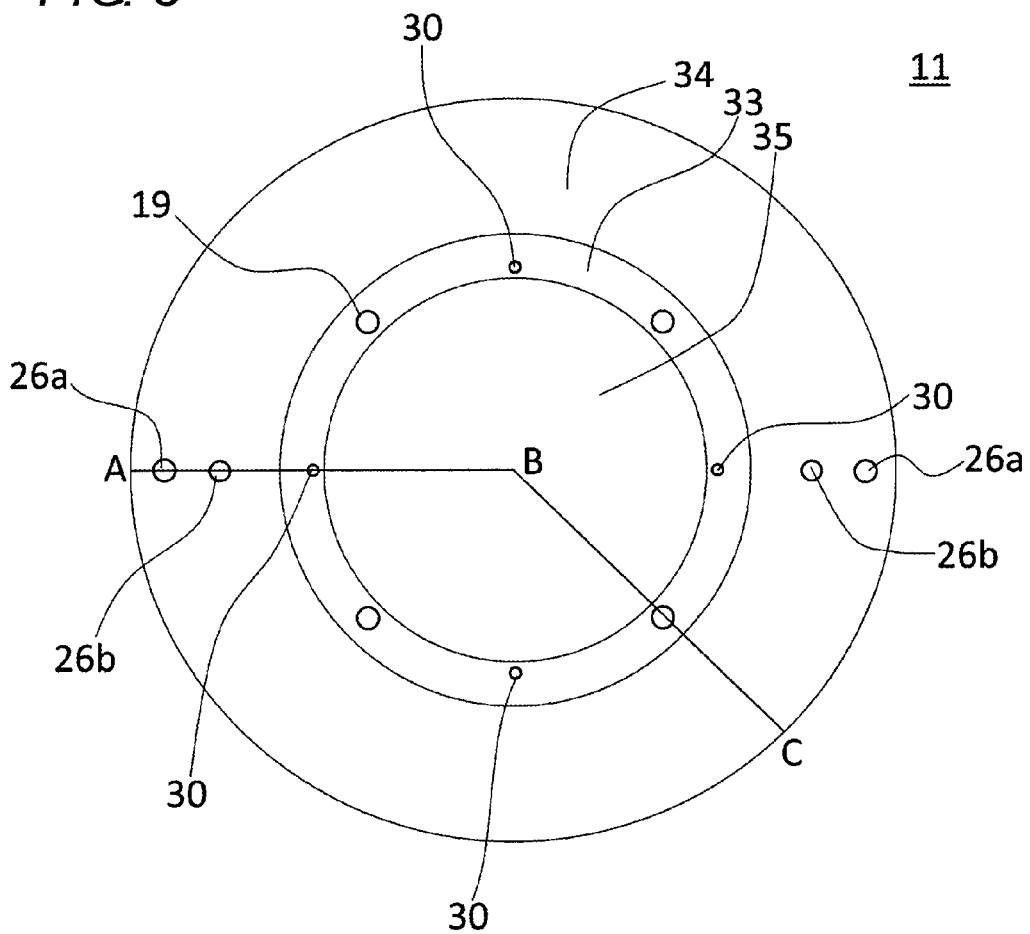
FIG. 3 is a top view schematically showing a stage 11 of FIG. 1.
Figure 4:
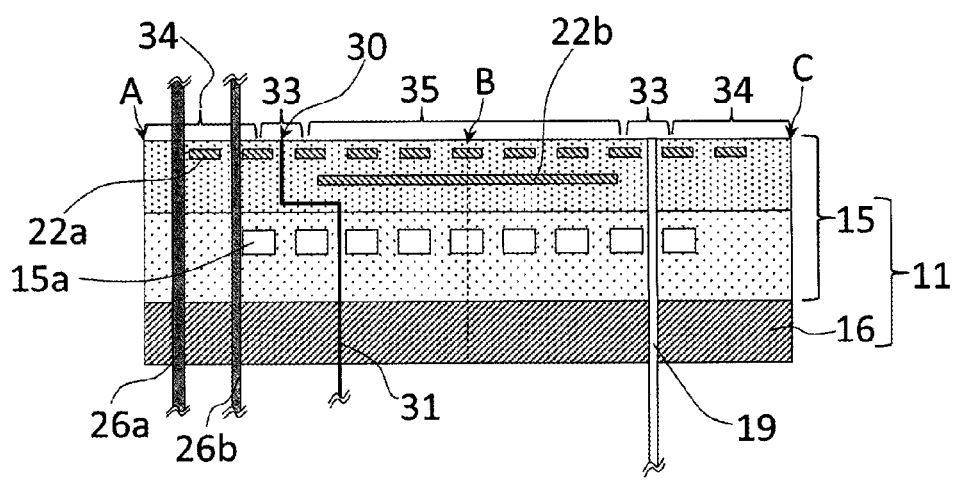
FIG. 4 is a schematic sectional view of the stage 11 cut along A-B-C in FIG. 3.

FIG. 3 is a top view schematically showing the stage 11 of FIG. 1. FIG. 4 is a schematic sectional view of the stage 11 cut along A-B-C in FIG. 3. FIG. 4 shows a state in a case that each of the cover 24 and the press mechanism 29 is at the lifted up position.

The upper surface (surface opposing the transfer carrier 4) 18 of the stage 11 has a ring-shaped first area 33 having the gas holes 30 and a ring-shaped second area 34 formed around the first area 33. A third area 35 is formed inside the first area 33. The first area 33 opposes the frame 7 via the holding sheet 6. At least a part (specifically, first area 33 side area) of the second area 34 preferably opposes the frame 7 or may oppose the frame 7 via the holding sheet 6. The third area 35 opposes the holding sheet 6 and also opposes the substrate 2 via the holding sheet 6. Alternatively, at least a part (specifically, first area 33 side area) of the third area 35 may oppose the frame 7 via the holding sheet 6.

In the example shown in the drawings, the four gas holes 30 are formed in the ring fashion with the same interval therebetween in the stage 11. Holes for housing the respective frame lift pins 19, for assisting the loading/unloading of the transfer carrier 4, so as to be liftable therein are formed in adjacent to the respective gas holes 30. The respective frame lift pins 19 are inserted into these holes. In the example shown in these drawings, the four frame lift pins 19 are arranged with the same interval therebetween in the first area 33. Further, the two first lift rods 26a for lifting-up/lowering the cover 24 and the two second lift rods 26b for lifting-up/lowering the press mechanism 29 are provided. FIG. 4 shows a state that the frame lift pin 19 is at the lowered position. Although, for convenience of explanation, the frame lift pins 19 and the gas holes 30 are disposed side by side as shown in FIG. 1, the frame lift pins 19 and the gas holes 30 are preferably arranged alternately with an interval therebetween as shown in FIGS. 3 and 4.

A degree of roughness of the third area 35 may be substantially same as a degree of roughness of the first area 33, but a degree of roughness of the second area 34 is preferably smaller than the degree of roughness of the first area 33. Each degree of the roughness of the first, second and third areas can be evaluated by an arithmetic average roughness Ra. Preferably, an arithmetic average roughness Ra1 of the first area is in a range from 1.6 to 2 μm and an arithmetic average roughness Ra2 of the second area is in a range from 0.1 to 1.2 μm. The arithmetic average roughness Ra1 and Ra2 preferably satisfy a condition of Ra2<Ra1 in these ranges.

In a case where the degree of roughness of the second area is preferably smaller than the degree of roughness of the first area, the adhesiveness between the transfer carrier 4 and the stage 11 at the frame 7 portion can be easily enhanced, and thereby the cooling gas supplied from the gas holes 30 is suppressed leaking outside from the first area. Further, as the cooling gas quickly wraps around the center portion of the transfer carrier 4 holding the substrate 2, the substrate 2 and the transfer carrier 4 can be cooled efficiently. Furthermore, as the adhesion between the transfer carrier 4 and the stage 11 at the frame 7 portion is enhanced, the frame 7 can be cooled efficiently. Thus, the cooling effect can be further enhanced. In particular, the cooling effect can be further enhanced easily in a case of pressing the frame 7 portion against the stage 11 by the press mechanism.

The degree of roughness of the third area inside the first area, specifically, an arithmetic average roughness Ra3 may be equal to or smaller than the arithmetic average roughness Ra1 of the first area (that is, Ra3≤Ra1). Ra3 may be in a range of, for example, 0.8Ra1≤Ra3≤Ra1.

The degree of roughness of the first area (specifically, Ra1) can be adjusted by polishing or blast-processing an area of the upper surface of the stage corresponding to the first area. For example, a degree of roughness of the polished or blast-processed portion can be made large by polishing or blast-processing the area corresponding to the first area 33 after smoothing the entirety of the upper surface 18 of the stage 11. In this case, when only the area of the upper surface 18 of the stage 11 corresponding to the first area 33 is polished or blast-processed, the second area 34 and the third area 35 each having the roughness of the original upper surface 18 of the stage 11 are formed together with the first area 33. In this case, a degree of the roughness of the second area 34 is substantially same as that of the third area 35. Alternatively, when respective areas of the upper surface of the stage corresponding to the first area 33 and the third area 35 are polished or blast-processed, the first area 33 and the third area 35 each having substantially the same roughness are formed together with the second area 34.

In terms of suppressing the leakage of the cooling gas outside the transfer carrier 4, the maximum height of the second area 34 is preferably higher than the maximum height of the first area 33. As the maximum height of the first area 33 is lower than that of the second area 34, the cooling gas discharged from the gas holes 30 likely fills in the first area 33 and an area inside the first area. Thus, the cooling effect can be enhanced easily. The maximum height of the third area 35 may be same (substantially same) as that of the second area 34 or may be same (substantially same) as that of the first area 33. In a case where the maximum height of the third area 35 is substantially same as that of the second area 34, as high adhesiveness can be ensured between the upper surface 18 of the stage 11 and the transfer carrier 4 in the third area 35, the cooling effect of the transfer carrier can be attained easily due to the contact with the cooled stage 11. In a case where the maximum height of the third area 35 is substantially same as that of the first area 33, as the cooling gas quickly wraps around the first area 33 and the third area 34, the cooling effect due to the cooling gas can be easily attained.

The maximum height can be lowered by polishing or blast-processing the upper surface 18 of the stage 11. For example, by polishing or blast-processing the area of the upper surface 18 of the stage 11 corresponding to the first area 33, the second area 34 and the first area 33 which maximum height is lower than that of the second area 34 can be formed. In this case, the maximum height of the third area 35 becomes substantially same as that of the second area 34. Alternatively, by polishing or blast-processing the respective areas of the upper surface corresponding to the first area 33 and the third areas 35, the maximum height of the third area 35 can be made substantially same as that of the first area 33.

In this specification, the maximum height in each of these areas basically means a height of a highest portion from a predetermined position (for example, a bottom surface of the dielectric layer 15b) in the each area, but alternatively may be a largest height (maximum height) obtained in a predetermined area of the each area. Same or substantially same in the maximum height means that a difference of the maximum height between one area and another area is, for example, in a range from 0 to 1.2 µm. For example, in a case where the maximum height of the second area (or the first area) is same or substantially same that of the third area, a difference of the maximum height between the third area and the second area (or the first area) is in a range from 0 to 1.2 µm.

Incidentally, the first area is not necessarily flat but a groove for flowing the cooling gas may be formed in this first area. By providing the groove, the cooling gas supplied from the gas holes 30 can be quickly spread to the entirety of the first area. The similar effect can be attained by forming a groove in the bottom surface of the frame 7 opposing the first area in place of forming the groove in the first area.

In FIG. 1, the cover 24 is not necessarily provided. That is, in place of providing the cover 24, the press mechanism 29 may have a function of shielding the frame 7 from plasma.

Figure 5:
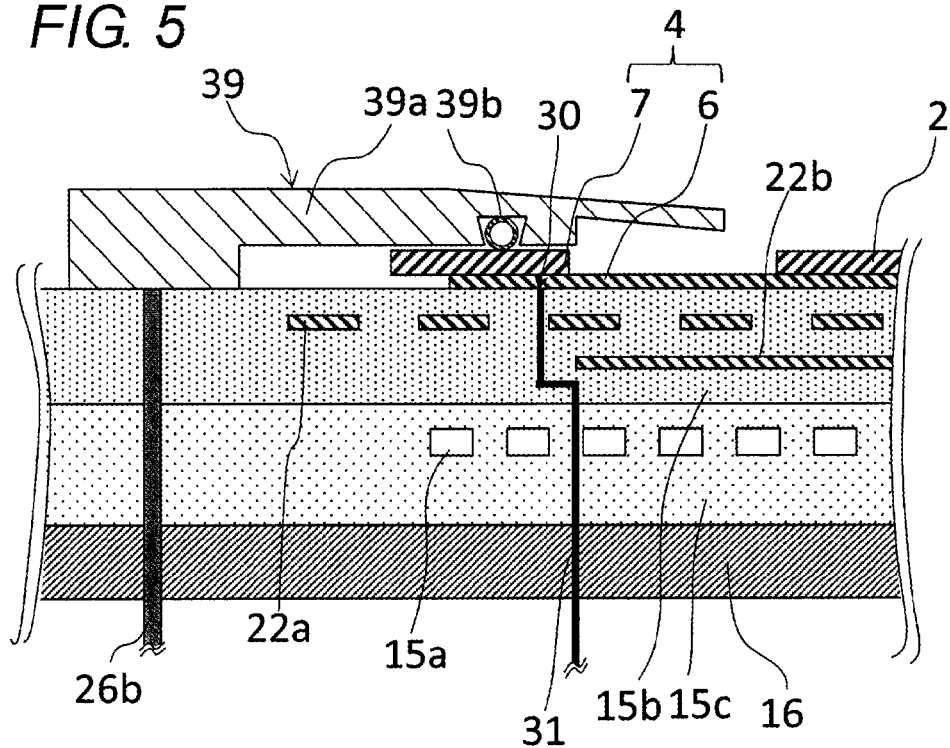
FIG. 5 is a sectional diagram schematically showing a press mechanism portion of a plasma processing apparatus according to another embodiment.
Figure 7:
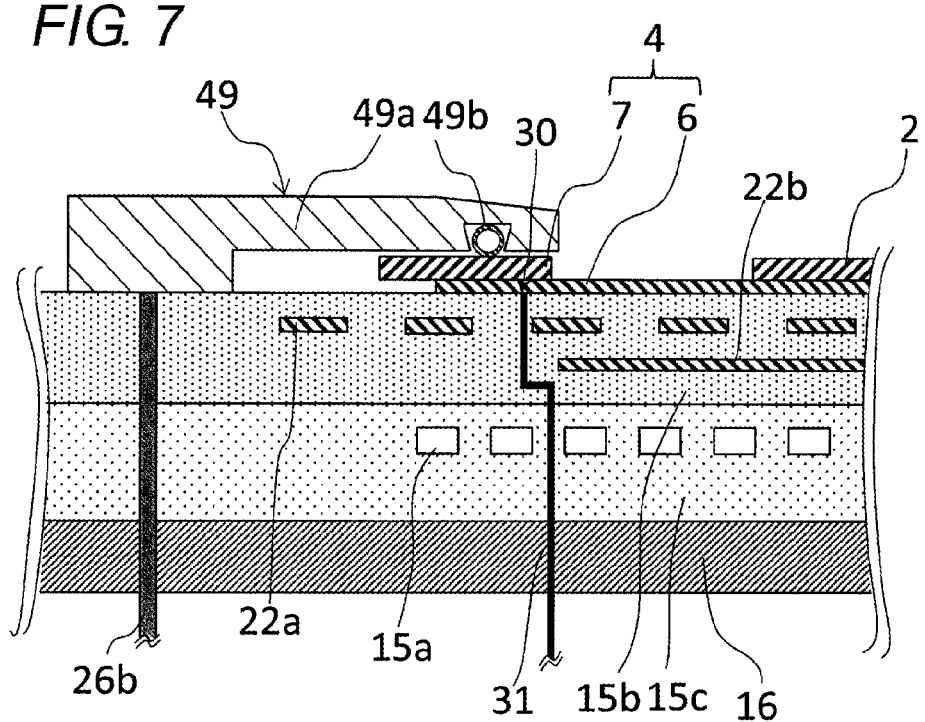
FIG. 7 is a sectional diagram schematically showing a press mechanism portion of a plasma processing apparatus according to still another embodiment.

Each of FIGS. 5 and 7 is a sectional diagram schematically showing a press mechanism portion in a case where the press mechanism has the function of shielding the frame 7 from plasma.

Figure 6:
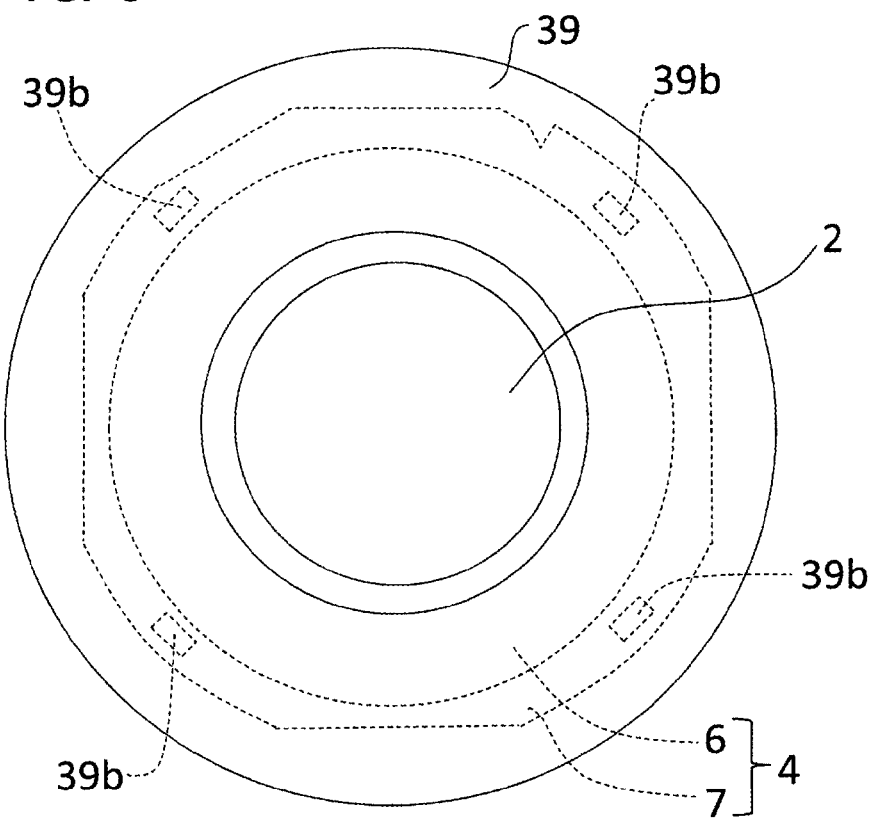
FIG. 6 is a top view of a press mechanism, a substrate and a transfer carrier in FIG. 5.
Figure 8:
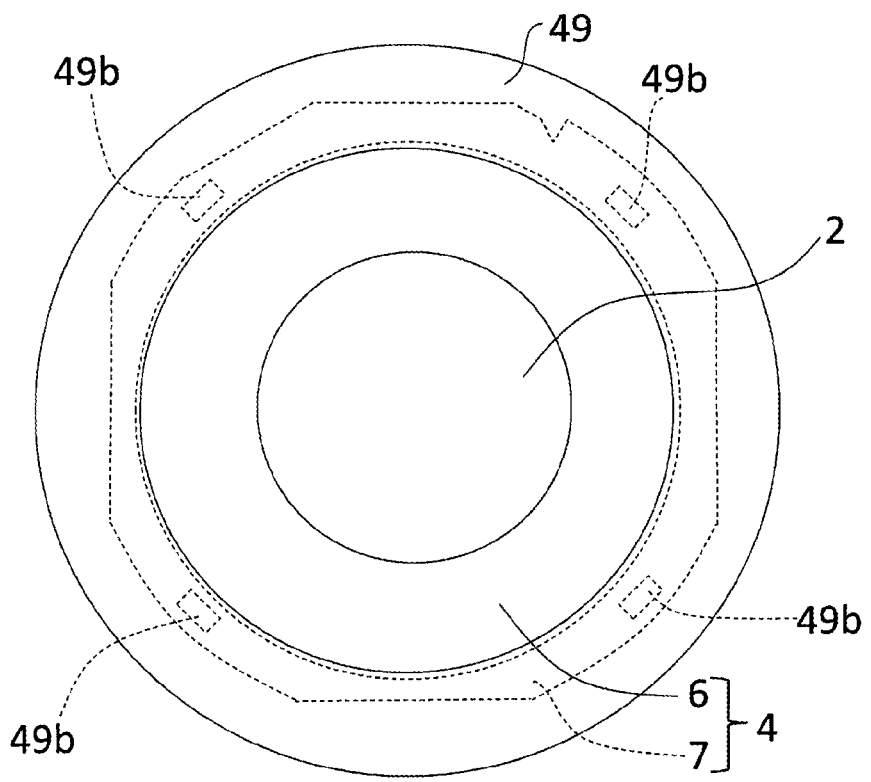
FIG. 8 is a top view of a press mechanism, a substrate and a transfer carrier in FIG. 7.

Each of FIGS. 6 and 8 is a top view of the press mechanism, a substrate and the transfer carrier in a case of providing the press mechanism shown in FIGS. 5 and 7.

A press mechanism 39 shown in FIGS. 5 and 6 includes an annular cover 39a formed so as to cover the frame 7 and elastic members (press members) 39b such as coil springs formed at one surface side of the annular cover 39a opposing the frame 7. In the example shown in these drawings, the annular cover 39a is formed to cover not only the frame 7 but also an almost entire area of the holding sheet 6 between the frame 7 and the substrate 2. Thus, each of the frame 7 and the holding sheet 6 is effectively suppressed being exposed to plasma during plasma processing. As the press mechanism 39 presses the frame 7 against the stage 11 by an elastic force of each of the elastic members 39b at a lowered position, the adhesiveness between the transfer carrier 4 and the stage 11 can be enhanced at the frame 7 portion. Thus, the cooling effect can be further enhanced due to the contact of the transfer carrier with the stage 11. Further, as the cooling gas easily wraps around in an area of the upper surface of the stage 11 opposing the bottom surface of the substrate 2, the substrate 2 and the transfer carrier 4 can be cooled more effectively.

A press mechanism 49 shown in FIGS. 7 and 8 includes an annular cover 49a formed so as to cover the frame 7 and elastic members (press members) 49b such as coil springs formed at one surface side of the annular cover 49a opposing the frame 7. In the example shown in these drawings, the annular cover 49a is formed to cover the frame 7 and to expose an almost entire area of the holding sheet 6 between the frame 7 and the substrate 2. The frame 7 is repeatedly used during plasma processing. In terms of preventing deterioration of the frame 7 due to repeated exposure to plasma, the annular cover is preferably formed to cover at least the frame 7. In the example shown in these drawings, the cooling effect similar to that in the case of FIGS. 5 and 6 can also be obtained.

Figure 9:
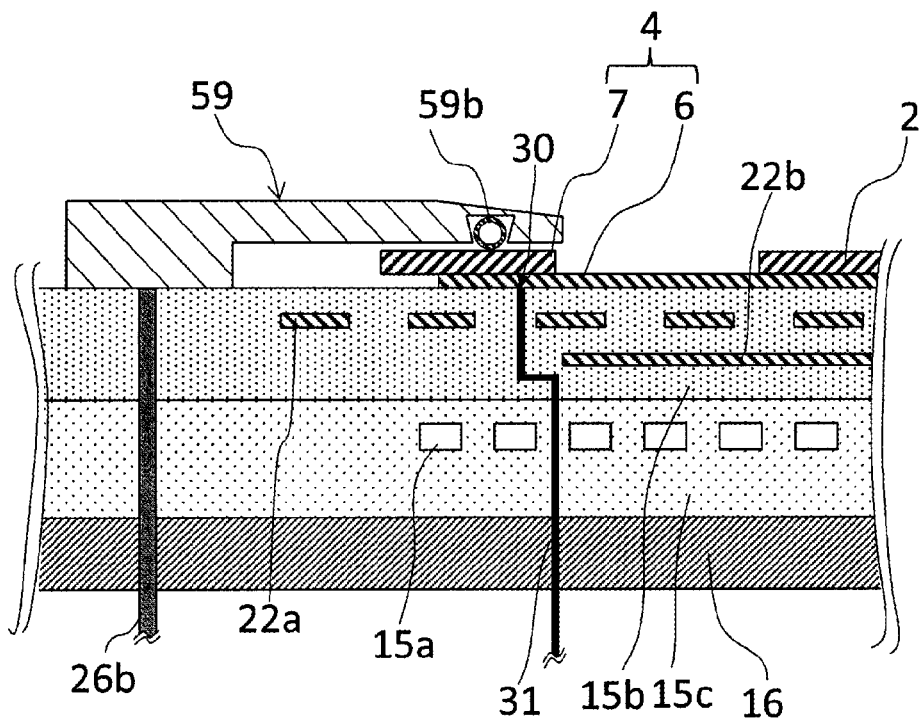
FIG. 9 is a sectional diagram schematically showing a press mechanism portion of a plasma processing apparatus according to still another embodiment.
Figure 10:
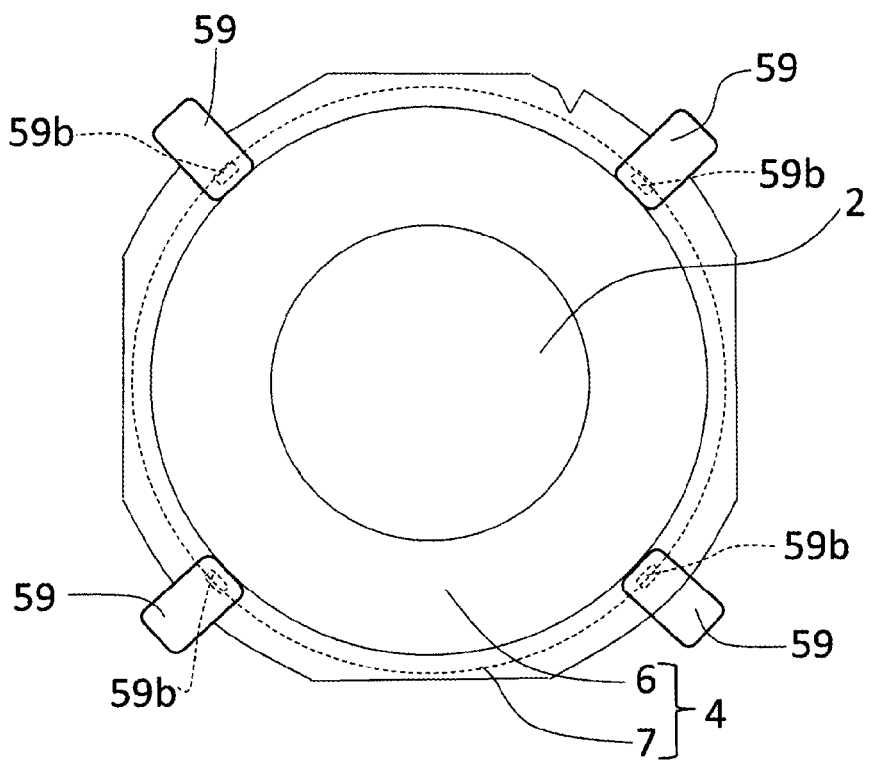
FIG. 10 is a top view of a press mechanism, a substrate and a transfer carrier in FIG. 9.

The press mechanism is not necessarily to have the annular cover so long as this mechanism can press the frame 7 of the transfer carrier 4 against the stage. FIG. 9 is a sectional view schematically showing a press mechanism portion of a plasma processing apparatus according to another embodiment. FIG. 10 is a top view of a press mechanism, a substrate and the transfer carrier in FIG. 9.

In FIGS. 9 and 10, each of press mechanisms 59 is a clamp having an elastic member (press member) 59b such as a coil spring. Each of the press members 59b is formed on one side of the corresponding clamp opposing the frame 7. As each of the press mechanisms having such the simple configuration can also press the frame 7 against the stage 11 to adhere the transfer carrier to the stage, excellent cooling effect can be obtained. Further, the leakage of the cooling gas to the outside can be suppressed. In a case of employing the press mechanisms 59 of FIGS. 9 and 10, the cover 24 may be provided so as to shield the frame 7 (and the holding sheet 6) from plasma.

In each of FIGS. 6, 8 and 10, the press members are formed at the positions overlapping with the frame 7. In the example shown in each of these drawings, although the four press members (press mechanisms 59 in FIG. 10) are formed with a same interval therebetween, the numbers and respective positions of the press members (press mechanisms 59) is not particularly limited. Further, each of the press members may be provided so as to be located above corresponding one of the gas holes 30 as shown in FIGS. 5, 7 and 9. Alternatively, each of the press members may be provided at a position deviated from the corresponding gas hole 30 (for example, outside of the corresponding gas hole 30).

Hereinafter, each of the constituent elements will be explained more in detail.

(Substrate and Transfer Carrier)

The substrate 2 as an object of plasma processing is not limited particularly. For example, monocrystalline Si, $SiO_2$, SiC or the like may be used as material of the substrate 2. A shape of the substrate 2 is also not limited particularly but may be, for example, a circle or a polygon. A size of the substrate 2 is also not limited particularly but, for example, a maximum diameter thereof may be almost in a range from 50 to 300 mm. A cutout such as an orientation flat or a notch may be provided at the substrate 2.

A resist mask (not shown) of a desired shape is formed on one major surface of the substrate 2 on which the holding sheet 6 is not pasted. A portion of the one major surface of the substrate, on which the resist mask is formed, is protected from being etched by the plasma. In contrast, a portion of the one major surface of the substrate, on which the resist mask is not formed, can be etched from the one major surface to an opposite major surface thereof.

The frame 7 may have an opening which area is equal to or larger than that of the substrate 2 as the object of plasma processing. The frame 7 has an almost-uniform thin thickness. A shape of the opening of the frame 7 is not limited particularly but may be, for example, a circle or a polygon such as a rectangle or a hexagon.

The frame 7 may be provided with a notch or a corner cut for positioning. For example, metal such as aluminum or stainless steel or resin may be used as material of the frame 7.

The holding sheet 6 preferably has a surface area slightly smaller than an area within an outer contour of the frame 7. A peripheral part of one surface of the holding sheet 6 is pasted on one surface of the frame 7 using adhesive. The holding sheet 6 is not required to be pasted over the entire width of the frame 7 but may be pasted on an area of the one surface in a range of about 10 mm from the inner periphery of the frame 7. Consequently, the holding sheet 6 can be fixed to the frame 7 so as to cover the opening of the frame 7. The holding sheet 6 can include, for example, UV-curable acrylic adhesive (adhesive surface 6a) and base material made of polyolefin (non-adhesive surface 6b).

The substrate 2 is pasted on the adhesive surface 6a of the holding sheet 6 so as to be located within the opening of the frame 7. In a case where the substrate 2 is merely pasted on the holding sheet 6, as the holding sheet 6 is flexible, it is difficult to stably transfer the substrate 2 (chip) divided into individual pieces by the dicing. By fixing the holding sheet 6, on which the substrate 2 is pasted, to the frame 7 having rigidity, the substrate 2 can be easily transferred even after the dicing.

The adhesive preferably contains material which adhesive force reduces by being irradiated with ultraviolet rays. In this case, the substrate (chip) divided into individual pieces can be easily exfoliated from the adhesive surface 6a by performing the ultraviolet ray irradiation after the dicing.

(Gas Holes)

A shape of each of the gas holes 30 is not limited particularly but may be a circle, an ellipse, a polygon (rectangle, hexagon, etc.) or the like. In this case, a size of each of the gas holes 30 is preferably set in a manner that a diameter of a corresponding circle having an area same as that of gas hole is in a range, for example, from 0.3 to 1.0 mm or from 0.5 to 0.8 mm.

(Electrostatic Chucking Electrode)

The electrostatic chucking electrode 22a is not necessarily provided at an area just beneath the frame 7. However, in a case where the frame 7 contains semiconductor material and/or conductor material, the electrostatic chucking electrode 22a is desirably provided near the mounting surface 18 within the dielectric part 15b in the area just beneath the frame 7. Consequently, for example, even in a case where a pressing force of the press mechanism 29 is loosened, the electrostatic chucking electrode 22a acts electrostatic force on the frame 7, thereby likely adhering the transfer carrier 4 to the stage 11 at the frame 7 portion. Once the frame 7 is pressed against the stage 11 by the press mechanism 29, thereafter, even if the pressing of the press mechanism 29 is released, a gap unlikely appears between the transfer carrier 4 and the stage 11 at the frame 7 portion due to the electrostatic chucking.

(Cover)

For example, ceramics such as quartz or alumina or aluminum having an anodized surface is used as material of the cover 24. In a case of using ceramics as material of the cover 24, a bottom surface of the cover 24 placed on the stage 11 may be made conductive by being subjected to a metal plating using Ni or the like. Alternatively, in a case of using the aluminum having the anodized surface as material of the cover 24, the bottom surface of the cover 24 placed on the stage 11 may be placed in a state of exposing aluminum by not being anodized or may be made conductive by being subjected to a metal plating using Ni or the like. In this manner, by imparting conductivity to the bottom surface of the cover 24, the cover 24 can be adhered to the stage 11 by the electrostatic chucking electrode 22a. As a result, the cover 24 can be cooled efficiently. Incidentally, the cover 24 is preferably provided so as to cover at least the entirety of the frame 7. Alternatively, the cover may be provided so as to cover entirety of an exposed portion of the holding sheet 6 between the frame 7 and the substrate 2 as well as the entirety of the frame 7. In these cases, each of the frame 7 and the exposed portion of the holding sheet 6 can be easily shielded from plasma. However, each of the frame 7 and an annular area of the holding sheet 6 may partially contain an area not covered by this cover.

The cover 24 desirably does not contact directly to the transfer carrier 4 or the substrate 2. The reason is to avoid transmission of heat of the cover 24, heated by plasma, to the transfer carrier 4 and the substrate 2.

Each of the embodiments explains a case that the cover 24 is movable with respect to the stage 11. However, the invention may also include a case that the cover 24 is fixed to, for example, a side wall of the chamber 3 and the stage 11 is movable with respect to the cover 24. Similarly, the press mechanism 29 may be fixed to, for example, the side wall of the chamber 3. In this case, the stage 11 is merely required to be movable with respect to the press mechanism 29.

(Press Mechanism)

A shape and material of the press mechanism (specifically, the annular cover or the clamp and the press member (elastic member), or the like) is not limited particularly. In terms of enhancing thermal conductivity, material of the press mechanism is preferably anodized aluminum or metal such as aluminum, aluminum alloy or stainless steel, or the like.

As shown in FIG. 1, the press mechanism may be configured in a manner that the cover 24 and the press mechanism are in a non-contact state in a case where the press mechanism presses the frame against the stage. In this case, as the cover 24 and the press mechanism are separated to each other, heat from the roof part of the cover 24 being exposed to plasma is unlikely transmitted to the press mechanism. Thus, the cooling effect of the transfer carrier 4 can be further enhanced.

(Other)

The first lift rods 26a for lifting-up/lowering the cover 24 and the second lift rods 26b for lifting-up/lowering the press mechanism may be driven so as to be lifted up and lowered by the common driving mechanism 27. For example, the first lift rods 26a and the second lift rods 26b may be coupled beneath the stage 11 so as to be lifted up and lowered simultaneously. The driving mechanism for lifting-up/lowering the first lift rods 26a and the second lift rods 26b is not limited particularly.

(Manufacturing Method of Electronic Component)

Next, a method for manufacturing an electronic component according to an embodiment of the invention will be explained.

In the manufacturing method of an electronic component uses the plasma processing apparatus which includes the chamber, the stage arranged within the chamber, the gas holes provided at the upper surface of the stage and the plasma exciting unit, the manufacturing method includes: (i) a preparing step of preparing the carrier (transfer carrier) holding a substrate; (ii) a mounting step of mounting the transfer carrier holding the substrate (start material of electronic components) on the upper surface of the stage; (iii) a gas supply step of, after the mounting step, supplying the cooling gas from the gas holes between the stage and the transfer carrier; and (iv) a plasma step of, after the mounting step, performing plasma processing on the substrate using plasma generated within the chamber by the plasma exciting unit, thereby obtaining the electronic components. The gas holes are provided at the respective portions of the upper surface of the stage opposing the bottom surface of the frame. Thus, by discharging the cooling gas from the gas holes, each of the substrate and the transfer carrier can be cooled efficiently by the cooling gas. The plasma processing apparatus described above can be used for the manufacturing method of electronic components.

The respective steps will be explained more in detail with reference to the constituent elements of FIGS. 1, 2A and 2B as needed.

(Step (i): Preparing Step)

In step (i), the substrate 2 and the frame 7 disposed around the substrate 2 are held by the holding sheet 6, thus preparing the transfer carrier 4 in a state of holding the substrate 2. Specifically, the substrate 2 and the frame 7 are pasted on the adhesive surface 6a of the holding sheet 6. The resist mask of the desired shape is formed on the one major surface of the substrate 2 being not pasted on the holding sheet 6. The portion of the one major surface of the substrate, on which the resist mask is formed, is protected from being etched by plasma. In contrast, the portion of the one major surface of the substrate, on which the resist mask is not formed, can be etched from this major surface to the opposite major surface thereof.

(Step (ii): Mounting Step)

In step (ii), the transfer carrier 4 holding the substrate 2 is loaded within the chamber 3 (specifically, the processing chamber 5) provided in the plasma processing apparatus 1 and then mounted on the stage 11 provided within the processing chamber 5. The transfer carrier 4 is mounted on the stage 11 in a posture of directing the surface holding the substrate 2 toward the upper electrode 9.

At the time of loading, the transfer carrier 4 holding the substrate 2 is transferred to the frame lift pins 19 at the lifted-up position. Then, the frame lift pins 19 are lowered, and thereby the transfer carrier 4 is mounted on the upper surface 18 of the stage 11 in a state of holding the substrate 2 thereon. Incidentally, in a case of mounting the transfer carrier 4 on the stage 11, as each of the cover 24 and the press mechanism 29 is in the lifted-up position, the mounting operation of the transfer carrier 4 is not interfered.

Next, the driving mechanism 27 moves the second lift rods 26b from the lifted-up position to the lowered position, and thus the press mechanism 29 presses the frame 7 of the transfer carrier 4 mounted on the stage 11 against the stage 11. Consequently, the distortion of the frame 7 is straightened so as not to generate slits due to the distortion between the frame 7 and the upper surface 18 of the stage 11. As the distortion of the frame 7 is straightened, the frame 7 can be surely made in contact with the upper surface 18 via the holding sheet 6. Further, as the distortion of the frame 7 is straightened, the floating of the holding sheet 6, pasted to the frame 7, with respect to the upper surface 18 can be suppressed and hence the holding sheet 6 can be surely made in contact with the upper surface 18.

In this manner, the press mechanism 29 can enhance the adhesiveness between the transfer carrier 4 and the stage 11 at the frame 7 portion. Thus, in a case of electrostatically attracting the transfer carrier 4 to the stage 11 and then performing cooling of the transfer carrier 4 and the substrate 2 by supplying the cooling gas in the next step, the leakage of the cooling gas outside the frame 7 portion can be suppressed more effectively. Further, as the cooling gas quickly wraps around the center portion of the transfer carrier 4, the substrate 2 and the transfer carrier 4 can be cooled efficiently.

Succeedingly, the first lift rods 26a are moved from the lifted-up position to the lowered position, and the cover 4 thereby covers the frame 7 and the part of the holding sheet 6 of the transfer carrier 4. In this case, the cover 4 also covers the press mechanism 29. In contrast, the substrate 2 is exposed from the window 25 of the cover 24. Although the embodiment indicates that the first lift rods 26a and the second lift rods 26b are lifted up and lowered by the respective driving mechanisms, the invention is not limited thereto. Each of the first lift rods 26a and the second lift rods 26b may be lifted up and lowered by the same driving mechanism as explained above. In a case of not providing the cover 24, only the second lift rods 26b may be lifted up and lowered.

Next, DC voltage is applied to the electrostatic chucking electrode 22a from the DC power supply 23, and thereby the transfer carrier 4 is electrostatically attracted to the mounting surface 18 of the stage 11.

(Step (iii): Gas Supply Step)

After the mounting step (ii), heat transfer gas such as He gas is supplied as the cooling gas between the stage 11 and the transfer carrier 4. In this case, the cooling gas is preferably supplied in a state that the transfer carrier 4 is electrostatically attracted to the stage 11. The gas holes 30 are provided at the respective positions of the upper surface 18 of the stage 11 opposing the bottom surface of the frame 7. The cooling gas supplied between the upper surface 18 and the transfer carrier 4 from the gas holes 30 promotes heat transfer between the stage 11 and the transfer carrier 4. Further, the coolant may be circulated through the coolant flow passage 15a from the coolant circulation unit 21 to cool the stage 11. In this case, the cooling efficiency of the transfer carrier 4 can be further improved.

(Step (iv): Plasma Step)

After the mounting step, plasma is generated within the chamber 3 (specifically, the processing chamber 5), and plasma processing is performed for the substrate 2 exposed from the window 25 of the cover 24. More specifically, the atmosphere within the processing chamber 5 is exhausted by the depressurizing mechanism 14 while introducing the porches gas for plasma dicing into the processing chamber 5 from the process gas source 12, thereby maintaining the atmosphere within the processing chamber 5 to a predetermined pressure. Thereafter, plasma is generated within the processing chamber 5 by supplying the radio frequency power from the first radio frequency power supply 10A to the upper electrode (antenna) 9, thereby irradiating the plasma to the substrate 2. In this case, the second radio frequency power supply 10B applies the bias voltage to the electrode part 15 of the stage 11.

The portions (streets) of the substrate 2 exposed from the resist mask are removed from the one major surface to the opposite major surface due to physicochemical action between radicals and ions within the plasma, thereby dividing the substrate 2 into a plurality of chips.

After completion of the plasma dicing, ashing is performed. Specifically, the atmosphere within the processing chamber 5 is exhausted by the depressurizing mechanism 14 while introducing process gas (for example, oxygen gas) for ashing into the processing chamber 5 from a not-shown ashing gas source, thereby maintaining the atmosphere within the processing chamber 5 to a predetermined pressure. Thereafter, plasma is generated within the processing chamber 5 by supplying the radio frequency power from the first radio frequency power supply 10A to the upper electrode (antenna) 9, thereby irradiating the plasma to the substrate 2. Thus, the resist mask is removed from the one major surface of the substrate 2 by irradiating the oxygen plasma to the substrate.

In this embodiment, in the plasma processing at least a part of the step (iv), the transfer carrier 4 holding the substrate 2 may be cooled (that is, the step (iii) may be performed) by supplying the cooling gas between the stage 11 and the transfer carrier 4 from the gas holes 30. In this case, although the step (iii) may be started after starting the step (iv), it is preferable to start the step (iv) after or simultaneously with the start of the gas supply in the step (iii). Consequently, the cooling effect of the transfer carrier 4 and the substrate 2 can be further enhanced.

After completion of the plasma dicing and the ashing, the transfer mechanism unloads the transfer carrier 4 from the processing chamber 5. Then, the transfer carrier is taken out from the plasma processing apparatus. The plurality of chips obtained by individualizing the substrate in the plasma dicing are separated from the holding sheet 6 of the transfer carrier 4. Then, the respective chips are mounted on packages in a packaging step, thereby finally manufacturing electronic components.

Specifically, after completion of the plasma processing, the application of DC voltage to the electrostatic chucking electrode 22a from the DC power supply 23 is stopped, thereby canceling the electrostatic attraction of the transfer carrier 4 to the mounting surface 18 of the stage 11. Then, the driving mechanism 27 moves each of the first lift rods 26a from the lowered position to the lifted-up position, thereby moving the cover 24 to the lifted-up position. Further, the driving mechanism 27 moves each of the second lift rods 26b from the lowered position to the lifted-up position, thereby moving the press mechanism 29 to the lifted-up position. Then, the driving mechanism 27 moves up each of the frame lift pins 19, thereby lifting up the frame 7 of the transfer carrier 4 to move the transfer carrier 4 to the lifted-up position. Thereafter, the transfer arm unloads the transfer carrier 4 from the processing chamber 5 in cooperation with the frame lift pins 19.

There may arise a case that electric charges is accumulated in the substrate 2 and the holding sheet 6 and remains even after completion of the plasma processing. In particular, the electric charges likely remains in the holding sheet 6 as insulator and the substrate 2 individualized by the plasma dicing. In this case, the transfer carrier 4 may be electrostatically attracted to the mounting surface 18 of the stage 11 by the residual charges. When the frame 7 is lifted up in this residual attraction state, there may arise such the problem that the holding sheet 6 is extended or wrinkles is developed therein. In order to mitigate the residual attraction, if a relatively low-power discharge is performed while supplying gas such as Ar gas or oxygen gas, the electric charges can be eliminated (discharge process for residual-charge elimination). Thus, if the discharge process for residual-charge elimination is performed before lifting up the frame 7 by the frame lift pins 19, this problem at the time of unloading due to the residual attraction can be mitigated.

However, if electric charges remains at a portion such as a rear surface of the holding sheet 6 where the static elimination effect by the discharge process for residual-charge elimination is unlikely attained, the residual attraction cannot be eliminated only by the discharge process for residual-charge elimination. Thus, when the frame 7 is lifted up, there may arise such the problem that the holding sheet 6 is extended or wrinkles is developed therein. In order to solve the problem, gas such as He gas may be discharged from the gas holes 30 of the stage 11 mounting the transfer carrier 4 thereon.

As the gas holes 30 are provided at the respective portions of the upper surface of the stage opposing the bottom surface of the frame 7, the gas supplied from the gas holes 30 flows toward the center side from an outer peripheral side of the transfer carrier 4 and spreads to the rear surface of the holding sheet 6 in the residual attraction state. As a result, the residual attraction state of the holding sheet 6 is gradually cancelled from an outer peripheral side thereof. In this manner, after the discharge process for residual-charge elimination, if the frame 7 is lifted up gradually while supplying the gas from the gas holes 30, the holding sheet 6 of the transfer carrier 4 can be separated from the stage 11 in a manner that the holding sheet is gradually exfoliated from the outer peripheral side thereof. Thus, the problem at the time of unloading due to the residual attraction can be mitigated.

The plasma processing performed in the plasma processing apparatus and the method for manufacturing an electronic component according to the embodiments of the invention is not limited to the plasma dicing and the plasma ashing, but may be normal dry etching. Further, the plasma processing apparatus is not limited to an ICP (Inductively Coupled Plasma) type according to the embodiments, but may be a parallel plate type.

Furthermore, the plasma processing apparatus according to the invention is not limited to the plasma dicing apparatus, but can also be applied to other plasma processing apparatuses such as a dry etching apparatus or a plasma CVD (Chemical Vapor Deposition) apparatus.

In the plasma processing apparatus and the method for manufacturing an electronic component according to the embodiments of the invention, the plasma processing can be performed while efficiently cooling a substrate held by the transfer carrier. Thus, one or more embodiments of the invention are useful for various kinds of plasma processing, and particularly for the plasma dicing for performing plasma processing on a substrate on which circuits are formed.

What is claimed is:
1. A method for manufacturing an electronic component using a plasma processing apparatus which comprises a chamber, a stage disposed within the chamber, a gas hole provided at an upper surface of the stage, and a plasma exciting unit, said method comprising:

preparing a carrier which holds a substrate as a start material of electronic components;

mounting the carrier, which holds the substrate, on the upper surface of the stage;

supplying cooling gas from the gas hole between the stage and the carrier after the carrier is mounted on the upper surface of the stage; and performing plasma processing on the substrate using plasma generated within the chamber by the plasma exciting unit after the carrier is mounted on the upper surface of the stage, thereby obtaining the electronic components, wherein the carrier comprises a frame disposed around the substrate and a holding sheet which holds the substrate and the frame, wherein the gas hole is provided at a portion of the upper surface of the stage opposing a bottom surface of the frame, wherein the upper surface of the stage comprises a first area having a first degree of roughness and a second area which is disposed around the first area and which has a second degree of roughness smaller than the first degree of roughness, wherein the gas hole is provided in the first area, and wherein a maximum height of the second area is higher than a maximum height of the first area.

2. The method for manufacturing an electronic component according to claim 1, wherein an arithmetic average roughness Ra1 representing the first degree of roughness is 1.6 μm or more and 2 μm or less, and wherein an arithmetic average roughness Ra2 representing the second degree of roughness is 0.1 μm or more and 1.2 μm or less.

3. The method for manufacturing an electronic component according to claim 1, wherein the upper surface of the stage further comprises a third area which is formed inside the first area and has a third degree of roughness, and wherein an arithmetic average roughness Ra3 representing the third degree of roughness is equal to or smaller than an arithmetic average roughness Ra1 representing the first degree of roughness.

4. A method for manufacturing an electronic component using a plasma processing apparatus which comprises a chamber, a stage disposed within the chamber, a gas hole provided at an upper surface of the stage, and a plasma exciting unit, said method comprising:

preparing a carrier which holds a substrate as a start material of electronic components;

mounting the carrier, which holds the substrate, on the upper surface of the stage;

supplying cooling gas from the gas hole between the stage and the carrier after the carrier is mounted on the upper surface of the stage; and performing plasma processing on the substrate using plasma generated within the chamber by the plasma exciting unit after the carrier is mounted on the upper surface of the stage, thereby obtaining the electronic components, wherein the carrier comprises a frame disposed around the substrate and a holding sheet which holds the substrate and the frame, wherein the gas hole is provided at a portion of the upper surface of the stage opposing a bottom surface of the frame, wherein the upper surface of the stage comprises a first area having a first degree of roughness and a second area which is disposed around the first area and which has a second degree of roughness smaller than the first degree of roughness, wherein the gas hole is provided in the first area, wherein the upper surface of the stage further comprises a third area which is formed inside the first area and has a third degree of roughness, wherein an arithmetic average roughness Ra3 representing the third degree of roughness is equal to or smaller than an arithmetic average roughness Ra1 representing the first degree of roughness, and, wherein a maximum height of the third area is the same as the maximum height of the second area.

5. A method for manufacturing an electronic component using a plasma processing apparatus which comprises a chamber, a stage disposed within the chamber, a gas hole provided at an upper surface of the stage, and a plasma exciting unit, said method comprising:

preparing a carrier which holds a substrate as a start material of electronic components;

mounting the carrier, which holds the substrate, on the upper surface of the stage;

pressing a frame against the stage by a press mechanism;

supplying cooling gas from the gas hole between the stage and the carrier after the carrier is mounted on the upper surface of the stage; and performing plasma processing on the substrate using plasma generated within the chamber by the plasma exciting unit after the carrier is mounted on the upper surface of the stage, thereby obtaining the electronic components, wherein the carrier comprises the frame disposed around the substrate and a holding sheet which holds the substrate and the frame, wherein the gas hole is provided at a portion of the upper surface of the stage opposing a bottom surface of the frame, and wherein the press mechanism comprises:
an annular cover which covers at least the frame; and
a press member which is formed at one surface side of the annular cover opposing the frame.

6. The method for manufacturing an electronic component according to claim 5, wherein the press member is an elastic member.

* * * * *